US005184082A

United States Patent [19]

Nelson

[11] Patent Number: 5,184,082

[45] Date of Patent: Feb. 2, 1993

[54] APPARATUS AND METHOD FOR TESTING AN ACTIVE MATRIX PIXEL DISPLAY

[75] Inventor: Larry A. Nelson, Albuquerque, N. Mex.

[73] Assignee: Honeywell Inc., Minneapolis, Minn.

[21] Appl. No.: 761,570

[22] Filed: Sep. 18, 1991

[51] Int. Cl.[5] ....................... G01R 31/02; G01R 27/02

[52] U.S. Cl. .................................... 324/537; 324/681; 324/73.1; 324/158 R; 324/158 T; 340/765; 340/784

[58] Field of Search ........... 324/537, 548, 681, 158 R, 324/158 T, 73.1; 357/4; 340/765, 784

[56] References Cited

U.S. PATENT DOCUMENTS

| | | | |
|---|---|---|---|
| 4,525,710 | 6/1985 | Hoshi et al. | 340/765 X |
| 4,731,610 | 3/1988 | Baron et al. | 340/765 X |
| 4,819,038 | 4/1989 | Alt | 324/158 T |
| 4,842,371 | 6/1989 | Yasuda et al. | 340/765 X |
| 4,843,312 | 6/1989 | Hartman et al. | 324/158 R |
| 5,113,134 | 5/1992 | Plus et al. | 324/158 R |

*Primary Examiner*—Jack B. Harvey
*Assistant Examiner*—Glenn W. Brown
*Attorney, Agent, or Firm*—Ronald E. Champion; George A. Leone, Sr.

[57] ABSTRACT

Apparatus and an associated method are described for testing liquid crystal matrix displays that can be performed prior to the assembly of the display. This display procedure involves applying of square wave signal to the control elements and a sine wave signal to the input terminal of an active element associated with the pixel under test. By selection of the sine wave signal frequency, the modulation products resulting from the combination of the square wave signals and the sine wave signal fall between the components resulting from the application of the square wave signal alone. As a result of the symmetry of the modulation components, a comb filter can be used to select the modulation components. The power of the transmitted modulation products provides a figure of merit for the active element associated with the pixel. A capacitor can be included along with the active element in the matrix display which couples the output signal of each active element to a row (control terminal) electrode on the same substrate as the active element. The capacitor provides an increase in the test result signal to noise level and permits testing of the active matrix substrate prior to display assembly.

32 Claims, 6 Drawing Sheets

APPARATUS AND METHOD FOR TESTING AN ACTIVE MATRIX PIXEL DISPLAY

This invention relates generally to active matrix displays having active pixel elements and, more particularly, to apparatus and method for testing active matrix displays.

BACKGROUND OF THE INVENTION

In a liquid crystal matrix display, a multiplicity of active elements, typically thin film field effect transistors, are each associated with a volume of liquid crystal that is the pixel element of the display. These active elements are fabricated on one of the two panels enclosing the liquid crystal material. When the active elements and/or associated circuits are defective, the associated pixel cannot be controlled and the display is correspondingly compromised. An individual pixel of the display is typically addressed by coupling the active elements in a grid consisting of rows and columns. The testing of the individual pixels has involved application of an activation signal to the control grid (gate terminal of a field effect transistor) of the active (row) element associated with the pixel under test and the application of a voltage designed to alter the optical properties of the liquid crystal volume associated with the (column) pixel to the input terminal (source terminal of a field effect transistor) of the active device. The display could be activated with an image that, when accurately represented by the liquid crystal display, would provide an opaque image. By proper illumination, the pixels that were not rendered opaque by the activating image could be determined by visual inspection.

The testing procedure of the related art suffered from several weaknesses. As the pixels have become smaller in order to achieve higher resolution images the ability to detect a malfunctioning pixel has become more difficult and time consuming. The principal disadvantage of the testing procedure of the prior art methods in addition to not lending itself to automated procedures, was that the testing could not be performed until the display was completely assembled, thereby minimizing the opportunity for repair of the defective elements.

A need has, therefore, been felt for apparatus and a related procedure that can test the active elements associated with each pixel of a liquid crystal display which is suitable for automation techniques. In addition, a testing technique is needed that can be performed after fabrication of the active elements, but before final assembly of the display.

SUMMARY OF THE INVENTION

The invention provides an improved apparatus and method of testing a liquid crystal display that applies a square wave signal and a sine wave signal to the active element associated with each pixel. The power of the modulation components in the pixel output signal provide a measurement of the performance of the active element.

It is an object of the present invention to provide an improved active matrix display testing apparatus and testing method.

It is a further object of the invention to provide an improved apparatus and method of testing an active liquid crystal matrix display technique wherein the testing of the liquid crystal display can be accomplished before the display back plate has been assembled and the liquid crystal added.

It is a still further object of the present invention to provide an improved liquid crystal matrix display test method and apparatus that employs a capacitor in the output circuit of each active element of a liquid crystal matrix display to couple the output signal of the active element to an unused electrode, enabling substrate test before display assembly.

The aforementioned and other objects are obtained, according to the present invention, by applying a square wave signal and a sine wave signal to an active element associated with a pixel. The modulation products resulting from the combination of the square wave and the sine wave signals in the active elements can be positioned between the spectral components of the components resulting from application of the square wave signal alone. This makes modulation products separable by filtering. The power of the modulation components provides a measure of the capability of the associated active element. To determine the power in the modulation products, the non-modulation products are removed by a comb filter. The signal power, resulting after the application of the comb filter is a measure of performance of the active element and associated circuits. The output signal from the active device can be measured at the common electrode of the liquid crystal display. To improve the signal to noise ratio of the active element output signal, the output signal is applied through a test capacitor, fabricated with each active element, to a currently unused electrode, typically a row electrode adjacent to the row electrode upon which the square wave is imposed. The presence of the test capacitor permits testing to take place prior to final assembly of the liquid crystal display.

Other objects, features and advantages of the present invention will become apparent to those skilled in the art through the Description of the Preferred Embodiment, Claims, and drawings herein wherein like numerals refer to like elements.

BRIEF DESCRIPTION OF THE DRAWINGS

To illustrate this invention, a preferred embodiment will be described herein with reference to the accompanying drawings. The preferred embodiment concerns an improved liquid crystal display testing method and apparatus.

DESCRIPTION OF THE PREFERRED EMBODIMENT

Figure 1:
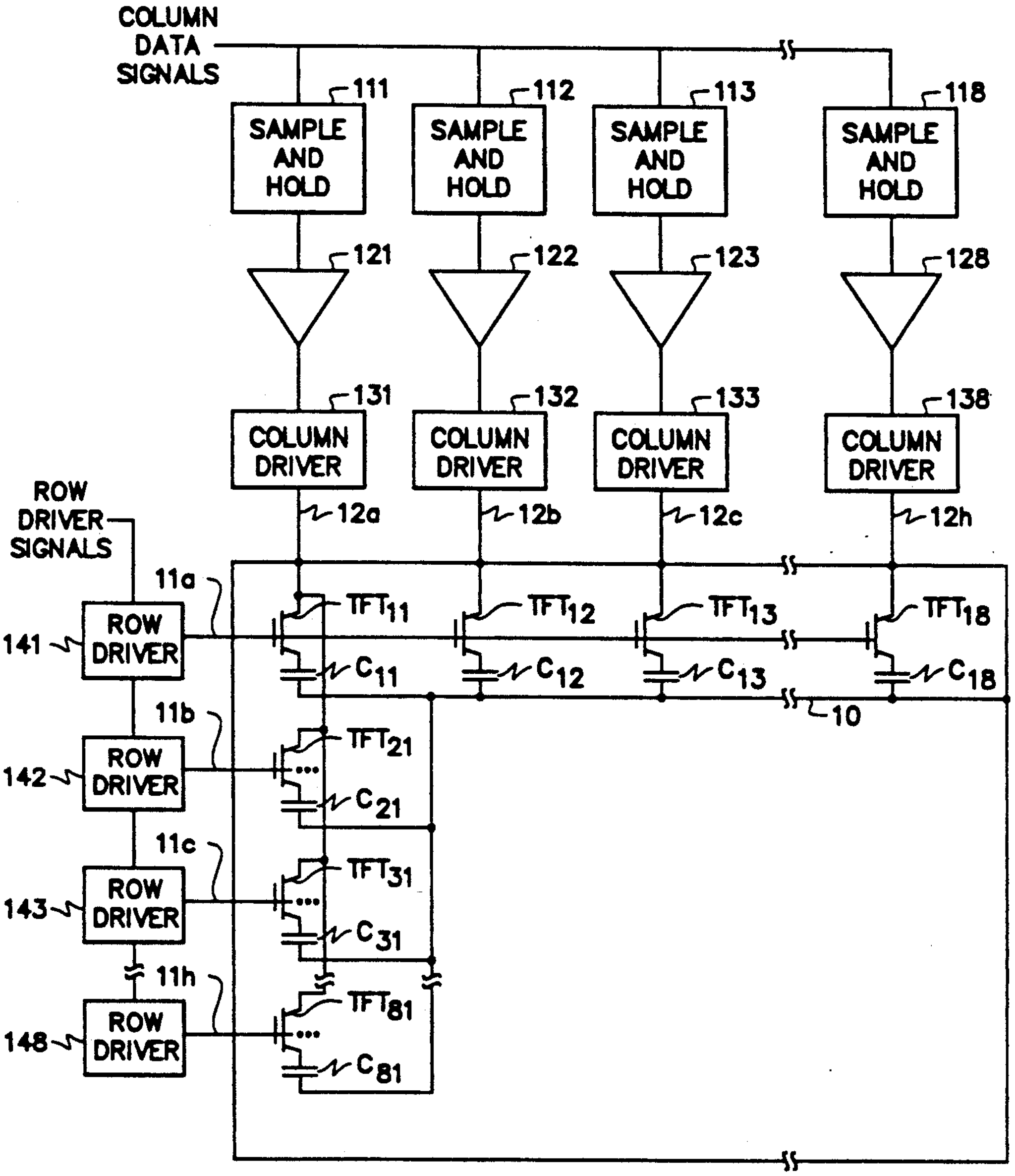
FIG. 1 is a block diagram of a typical liquid crystal active matrix display.

The preferred embodiment of the invention concerns the testing of active matrix liquid crystal displays that employ active elements in their construction. FIG. 1 shows a block diagram of the electronic components used in a liquid crystal active matrix display. The optically active elements are represented by the array of capacitors $C_{mn}$. A first terminal of each capacitor $C_{mn}$ is coupled to a ground or common terminal 10. Associated with each capacitor $C_{mn}$ is a thin film transistor $TFT_{mn}$. The drain terminal of each thin film transistor $TFT_{mn}$ is coupled to a second terminal of the associated capacitor $C_{mn}$. Each row of thin film transistors $TFT_{mn}$ has associated therewith a row driver 141–148. Each row driver is coupled to a gate terminal of every $TFT_{mn}$ in the associated row. Similarly, each column of thin film transistors $TFT_{mn}$ has associated therewith a column driver 131–138, each column driver 131–138 being coupled to a source terminal of every thin film transistor $TFT_{mn}$ in the associated column. The row drivers activate a row of thin film transistors $TFT_{mn}$ while the column drivers provide signal amplitude related to the display image to the active element $C_{mn}$ when the associated thin film transistor $TFT_{mn}$ is activated by a row driver 141–148. In the preferred embodiment, the image to be displayed is typically provided as a time dependent analog signal. Associated with each column driver 131–138 is a sample and hold circuit 111–118 which provides a sample of the video signal at the appropriate spatial positions. This signal is buffered through amplifiers 121–128 to the column drivers 131–138.

Figure 2:
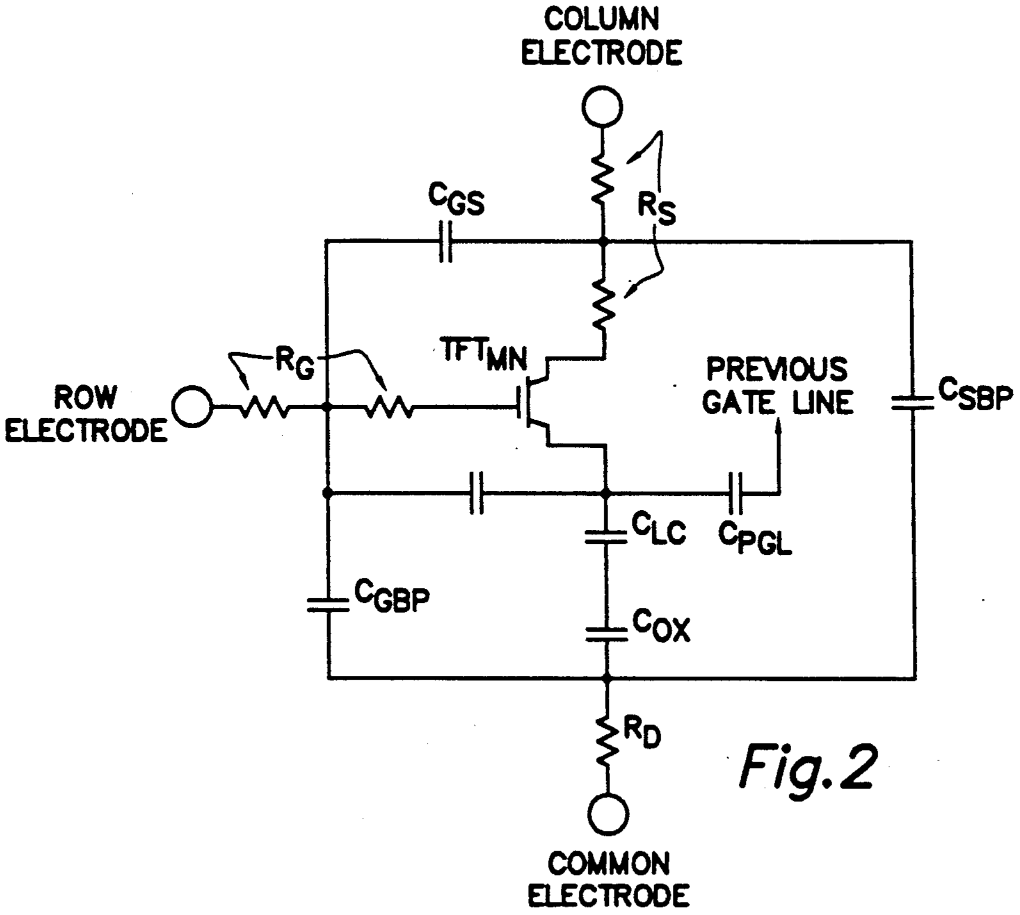
FIG. 2 is an incremental equivalent circuit of the matrix display illustrating elements affecting the A.C. response of the matrix display.

Referring to FIG. 2, the equivalent circuit parameters are identified for the interconnection of the thin film transistor $TFT_{mn}$ into a matrix using row and column electrodes. The values of these parameters for elements used in the preferred embodiment have been determined. The thin film transistor gate terminal resistance $R_G \sim 60\Omega$/cell, the thin film transistor source terminal resistance $R_S \sim 2.5\Omega$/cell and the resistance between the common electrode (i.e., on the back plate) and the pixel capacitor $R_D \sim 100\Omega$/cell. The capacitance between the gate terminal and the source terminal $C_{GS} \sim 3.4 \times 10^{-14}$F (Farads), while the capacitance between the gate terminal and the drain terminal $C_{GD} \sim 1.7 \times 10^{-14}$F. The capacitance between the gate and the back plate (i.e., common electrode) $C_{GBP} \approx 1.6 \times 10^{-14}$F, while the capacitance between the source terminal and the back plate $C_{SBP} \approx 1.0 \times 10^{-14}$F. The capacitance between the thin film transistor drain terminal and the previous gate line is $C_{PGL} \approx 0.8 \times 10^{-9}$F. The capacitance associated with the dc blocking capacitor ($C_{OX}$) is selected to be large compound to $C_{LL}$(ON). $C_{OX} \approx 2.7 \times 10^{-13}$F. The capacitance of the liquid crystal cell when optically active is given by $C_{LC}(ON) \approx 2.7 \times 10^{-14}$F, while the capacitance of the liquid crystal cell when not optically active is $C_{LL}(OFF) \approx 9.3 \times 10^{-13}$F. The ratio $C_{LC}(off)/C_{GD} \approx 5.4$ and the saturated drain current $I_{DSAT}$ is approximately equal to $3.0 \times 10^{-7}$AMP. The capacitance of the column to common electrode ($C_{SBP}$) (backplate) and the capacitance for the gate to common electrode ($C_{GBP}$) increases as the number of pixels in the display increases, i.e., the display area increases in size. The capacitances of the individual elements remains the same.

Figure 3:
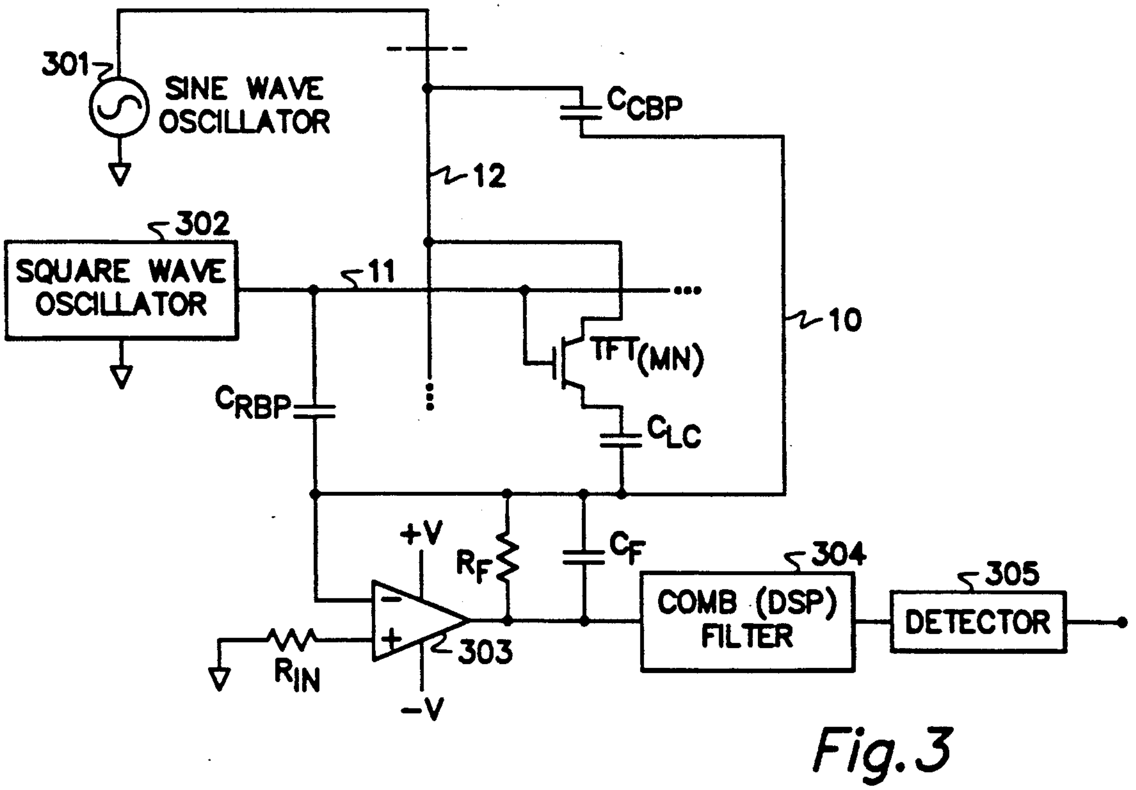
FIG. 3 is a block diagram of the apparatus used to test the pixel elements of the liquid crystal display.

Referring next to FIG. 3, apparatus for testing an active element of a flat panel liquid crystal display is shown. A thin film transistor, $TFT_{mn}$, has a gate terminal coupled to a row electrode 11 and a source terminal coupled to a column electrode 12. The drain terminal of the thin film transistor $TFT_{mn}$ is coupled though the pixel capacitor $C_{LC}$ to the common electrode (or backplate) 10. The capacitance between the row electrode 11 and the common electrode 10 is given by $C_{RBP}$, while the capacitance between the column electrode 12 and the common electrode 10 is given by the value of the capacitor $C_{CBP}$. The row electrode has a square wave oscillator 302 coupled thereto, while the column electrode 12 has a sine wave oscillator coupled thereto. The common electrode is coupled to an inverting terminal of difference amplifier 303, while the non-inverting terminal of the difference amplifier 303 is coupled through input resistor $R_{IN}$ to ground potential. The output terminal of difference amplifier 303 is coupled through feedback resistor $R_F$ to the common electrode 10, is coupled through feedback capacitor $C_F$ to the common electrode and is coupled to an input terminal of comb filter 304. The output signal of the comb filter 304 is coupled to detector 305, the output signal of detector 305 being a signal related to a predetermined pixel element of the matrix display.

Referring to FIGS. 4a–4e, the time dependencies of selected signals in FIG. 3 are shown. In FIGS. 4a the output signal for the square wave oscillator 302 driving the row electrode 11 is illustrated. In FIG. 4b the time dependence of the output signal of the sine wave oscillator 301 driving the column electrode 12 is illustrated. In FIG. 4c the current through the liquid crystal (capacitor $C_{LC}$) is shown as a function of time. Similarly, the current between the row electrode 11 and common electrode 10 (via parasitic capacitance $C_{CBP}$) is illustrated as a function of time by FIG. 4d, while the current between the column electrode 12 and the common electrode 10 (via parasitic capacitance $C_{CBP}$) is shown as a function of time in FIG. 4e.

Figure 5:
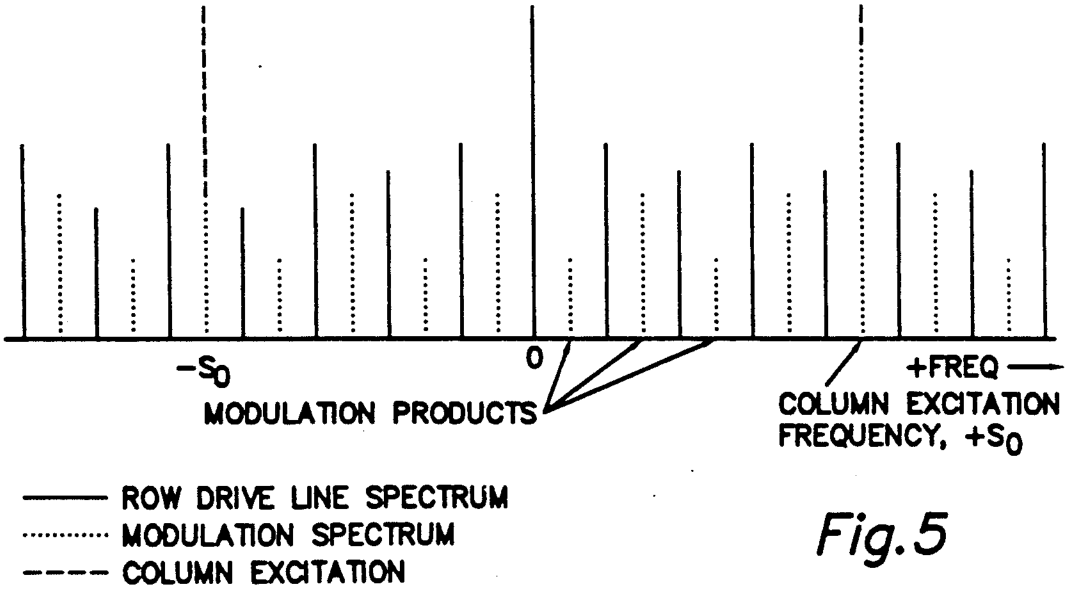
FIG. 5 illustrates the power spectrum derived from modulation of the matrix display active element by the square wave signal and the sine wave signal of appropriately selected frequencies for generation of frequencies resulting in the maximum separability of modulation products from signals related linearly to the input signals.

Referring to FIG. 5, the result of combining the square wave signal and the sine wave signal in the thin film transistor and taking the modulus squared of the Fourier transform thereof is shown. The solid lines illustrate the component frequencies caused by the current which enters the common electrode through $C_{RBP}$ (curve d) while the dotted lines indicate the frequencies introduced by the modulated sine wave (curve c). The frequency $s_O$ is the frequency of the applied sine wave and, in addition to the contribution through the liquid crystal (curve c), receives signal through $C_{CBP}$ (curve e). The square wave frequency and the sine wave frequency are selected so that the modulation products (i.e. the dashed lines) fall midway between the spectrum resulting from the square wave drive signal so that the positive and negative frequency components reinforce. The spectrum illustrated by FIG. 5 is idealized as if the square wave excitation and the sine wave excitation continue without interruption (completely periodic). Those skilled in the art, having the benefit of this disclosure will appreciate that no linear path exists within the active matrix display that can produce frequencies (except at +/− $s_O$) at intermediate frequencies between row excitation frequencies (solid lines). Only the active device (modulator) can produce this energy. Thus a basis for measuring very small signals associated only with TFT operation is established, since large interfering signals can be eliminated by filtering.

Figure 6:
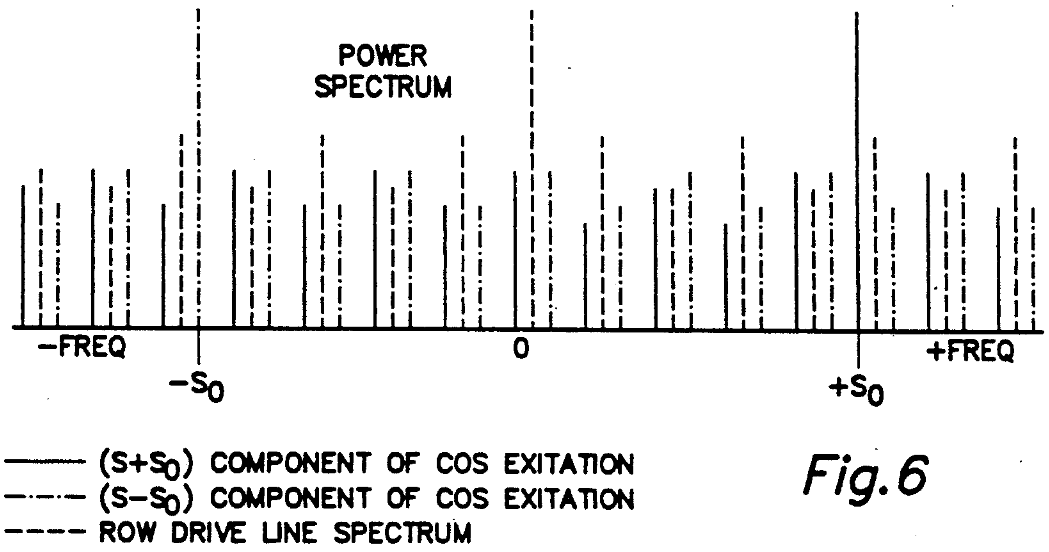
FIG. 6 illustrates the power spectrum derived from modulation of the matrix display active element by the square wave signal and the sine wave signal of appropriately selected frequencies for generation of frequencies which do not cause overlap of positive and negative frequency modulation products.

Referring to FIG. 6, the power spectrum is illustrated for the situation where the square wave frequency and the sine wave frequency are chosen so that the modulation products caused by positive and negative frequencies in the excitation of the source electrode do not reinforce. The spectrum is once again idealized as if the square wave modulation and the sine wave modulation were periodic over an infinite time interval.

Figure 7:
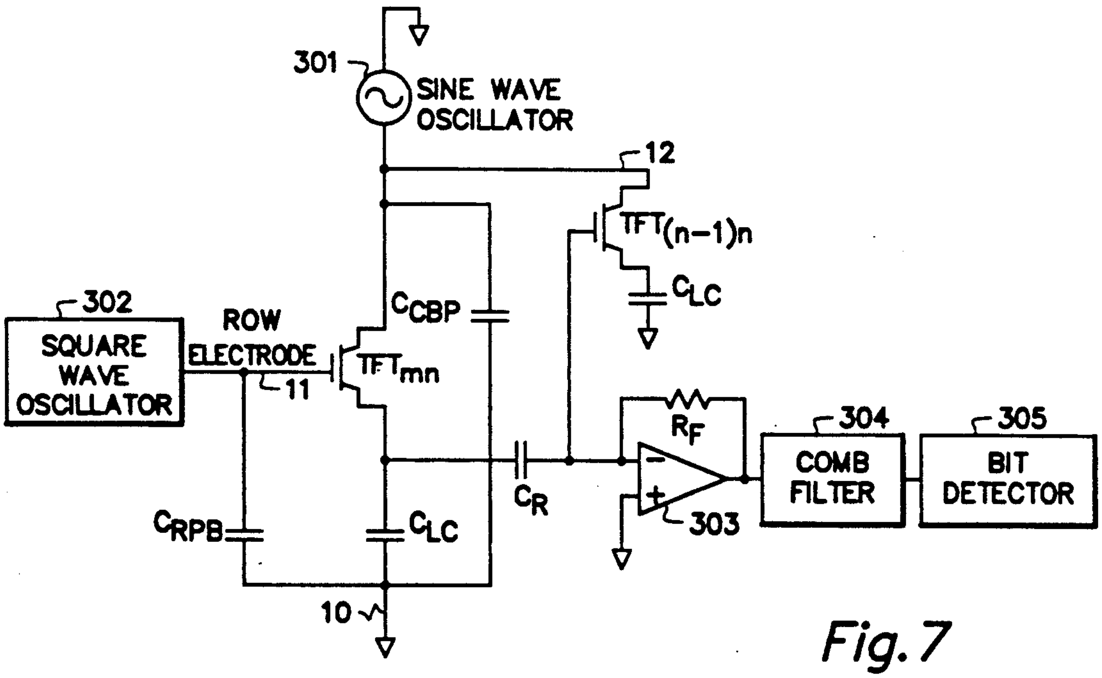
FIG. 7 is a block diagram of the coupling between thin film transistors by means of a substrate capacitor.

Referring next to FIG. 7, the square wave oscillator 302 is coupled to row electrode 11. The parasitic capacitance $C_{RBP}$ is present between the row electrode 11 and the common electrode 10. The sine wave oscillator 301 is coupled to column electrode 12. The column electrode 12 is coupled to thin film transistor $TFT_{mn}$ and to thin film transistor $TFT_{(m-1)n}$. The thin film transistor $TFT_{mn}$ is coupled to row electrode 11, while the film transistor $TFT_{(m-1)n}$ is coupled to row electrode 11′ (previous row). 303 is referenced to ground at its non-inverting input. This causes the row drive of $TFT_{(m-1)n}$ to be biased OFF. Current which flows through $C_T$ must pass through $R_F$. Thus an output signal is developed which is predominately responsive to the modulation products. The output terminal of transimpedence amplifier 303 is coupled through comb filter 304 to detector 305.

Figure 8:
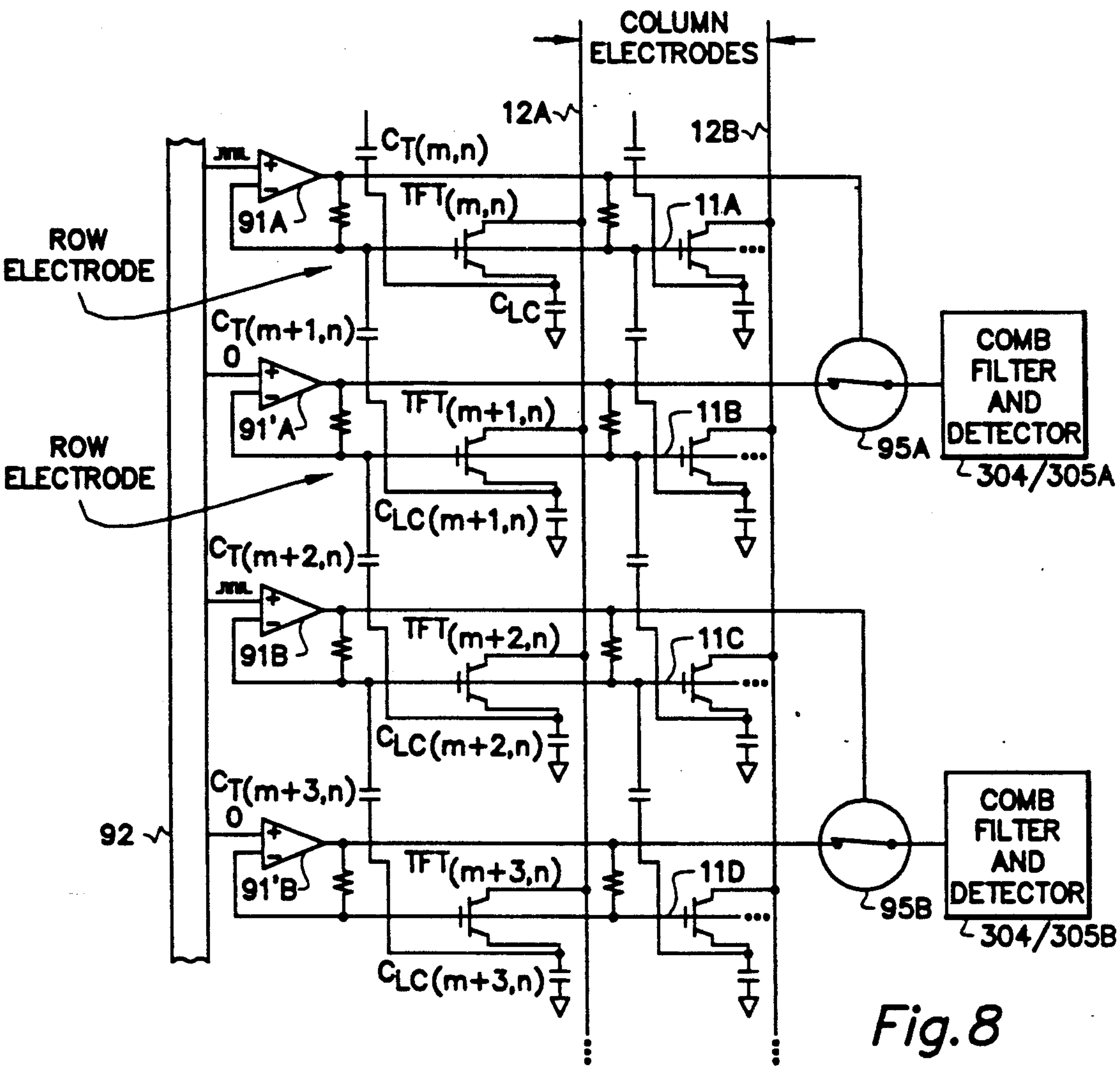
FIG. 8 is a block diagram of a plurality of columns and rows of pixel elements in a liquid crystal display in a configuration for testing the pixel elements.

Referring next to FIG. 8, a testing configuration using capacitances, of the type illustrated in FIG. 7 is shown. Each of the row electrodes is coupled to the inverting terminal of an associated amplifier, e.g., row electrode $\mathbf{11}_A$ is coupled to the inverting terminal of amplifier $\mathbf{91}_A$, etc. The output terminals of the operational amplifiers are coupled to a first input terminal of a two position switch, the second input terminal of the two position switch being coupled to the output terminal of the difference amplifier associated with the second row electrode pair, e.g., the output terminal of the difference amplifier $\mathbf{91}_A$ is coupled to a first input terminal of switch $\mathbf{95}_A$ while the output terminal of difference amplifier $\mathbf{91'}_B$ is coupled to the second input terminal of switch $\mathbf{95}_A$. The output terminal of each switch is coupled to a comb filter/detector combination, e.g., the output terminal of switch $\mathbf{95}_A$ is coupled to comb filter/detector unit $\mathbf{304/305}_A$. Each thin film transistor has a source terminal coupled to a column electrode, the gate terminal is coupled to the inverting input terminal of an associated difference amplifier and the drain terminal is coupled through the liquid crystal capacitor $C_{LC}$ to the common electrode and through the test capacitor $C_T$ to the row electrode of the previous row, e.g., thin film transistor $TFT_{(m+2,n)}$ has a gate terminal coupled to row electrode $\mathbf{11}_C$, a source terminal coupled to column electrode $\mathbf{12}_A$ and a drain terminal coupled through capacitor $C_{LC(m+2,n)}$ to the common electrode and through capacitor $C_{T(m+2,n)}$ to row electrode $\mathbf{11}_B$. The non-inverting input terminals of the difference amplifiers are coupled to register 92 which applies a square wave signal to every other difference amplifier and a dc reference (shown as 0 volts) to the un-driven terminals in alternating fashion as shown.

Those skilled in the art will appreciate that multiple testing of every other row of pixels is herein described by way of example and not limitation. Alternatively, every three or four rows could be multiplexed to a single filter/detector, for example.

Figure 9:
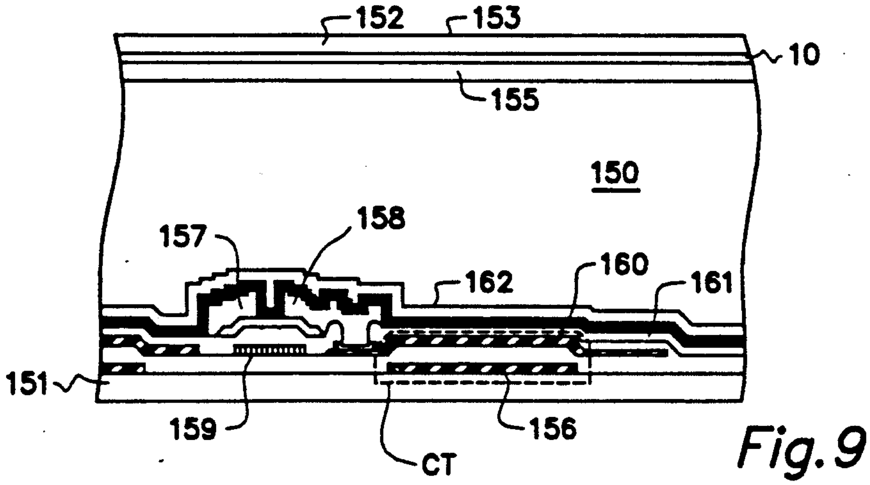
FIG. 9 is a cross section view of a liquid crystal display, including a thin film transistor, illustrating one configuration for including a capacitance between the row electrodes.

Referring next to FIG. 9, a cross section view of a liquid crystal display, including a thin film capacitor, according to the preferred embodiment is shown. The liquid crystal display includes two transparent planar structural members, 151 and 152, which provides the structural support for the display. The structural members, 151 and 152, are generally parallel, held in the parallel configuration by spacing elements not shown in FIG. 9, and are fabricated from a transparent material. Polarizing material 153 needed to control, in conjunction with the liquid crystal material, the optical transmission is positioned on the exterior surface of the planar structural member 152. On the interior surface of one of the structural members 152, a conducting material is deposited to form the common electrode 10. On the inner surface of the common electrode 10, an aligning layer 155 is positioned to control the alignment of the liquid crystal molecules in the absence of the applied electric field. A conducting region 156, which will form one surface of the test capacitor $C_T$, associated with each thin film capacitor, is deposited on the interior surface of the structural member 151. A layer of $SiO_2$ is then formed over the conducting regions 156 and the exposed regions of structural member 151. Appropriate processing and deposition of materials is performed to provide a thin film transistor TFT having a source region 157, a drain region 158 and a gate region 159. In addition, a conduction region 160 is coupled to the drain terminal of each thin film transistor TFT, the conducting region 160 forming, along with the common electrode 10, the capacitance for applying an electric field to the liquid crystal material 150. The conductor region 160 is positioned relative to conducting region 156 to form the capacitor $C_T$. The conducting region 156 has a conducting path that is coupled to the row electrode prior in sequence to the thin film transistor row with which the conducting region is associated. An insulating layer 161 is formed over the thin film transistor and the associated elements located on the interior surface of structural member 151. An aligning layer 162, for alignment of the liquid crystal molecules, is then formed over insulating layer 161. The liquid crystal material 150 is contained between the aligning layers 155 and 162.

Figure 10:
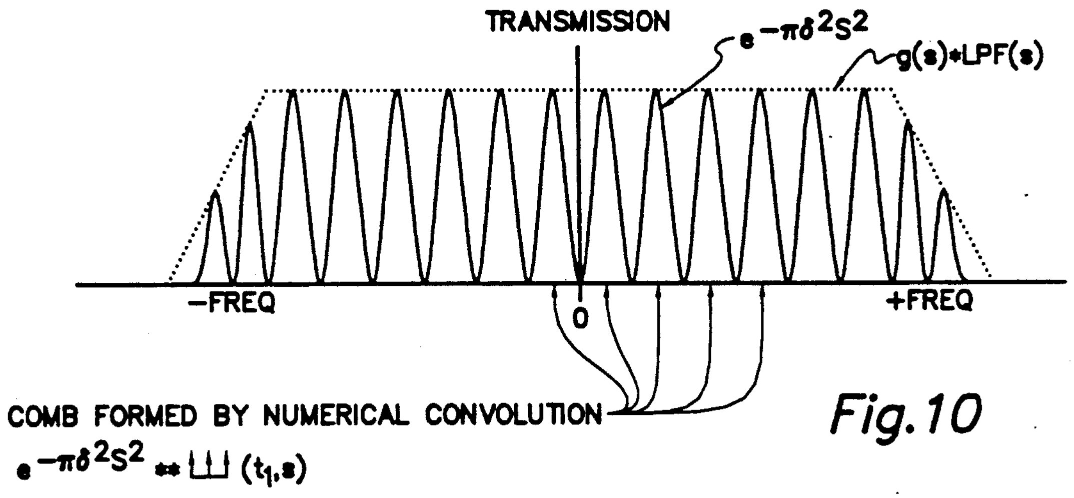
FIG. 10 illustrates the spectral profile of a comb filter.

Referring to FIG. 10, the frequency response of a comb filter is shown. The comb filter has an envelope formed from the transconductance function of the input element g(s) multiplied by the LPF(s) which represents the band limiting filter and the carrier frequency notch filter. In an illustrative example, the individual transmitting portions of the comb are given by $$e^{-\pi\sigma^2 s^2}.$$

The comb filter has the property that harmonically related frequencies can be transmitted.

Referring to FIG. 10, a configuration for testing the pixels of a liquid crystal display is shown. The difference amplifier 91 driving the row electrode 11 has the capacitor associated with the thin film transistor under test coupled thereto. The signal to the non-inverting terminal of amplifier 91 is a logic "0" when the next consecutive row electrode, the row including the thin film transistor under test, is activated by a square wave signal. Referring now to FIG. 12, the output signal of the difference amplifier is a voltage analog of the current through $C_T$ which is applied to an amplifier 181 which has a transfer function represented by the LPF(s) function (c.f., FIG. 10). The output signal of the amplifier 181 is applied to a sample and hold register 182, the sample and hold register periodically storing a current signal level from the output of amplifier 181. The output signal from the sample and hold circuit 182 is applied to A to D converter 183. The A to D converter 183 takes the sampled analog voltage signal in the sample and hold circuit 182 and provides a related quantized signal at the output terminal. The quantized output signal from the A to D converter 183 is applied to the data processing unit 190. The programs of the data processing unit implement the comb filter by minimal convolutions of the input signal with a sampled (in this example—Gaussian) filter characteristic. The comb filter algorithm is selected so that the maximum signal attenuation occurs for frequency components resulting from the application of the square wave frequency to the row electrodes. The passband portions of the comb filter are arranged to pass the modulation products of the frequency applied to the column electrodes. The signal resulting from the convolution of the signal from the A to D converter 183 and the comb filter algorithm is summed, providing a signal that is input to a detector 193. The resulting signal is compared with a threshold signal to determine if the signal from the detector (stage or algorithm) meets the performance criteria for a functional active element associated with a liquid crystal display pixel. The relative goodness of the TFT under test is proportional to the detector output.

2. Operation of the Preferred Embodiment

Although the foregoing description is technical in nature, the concept underlying the technique of the present invention can be understood in the following manner. A square wave signal is used to activate the row bus periodically, while a sine wave signal is used to activate the column bus continuously during the test procedure. The combination of the periodic square wave signal and the continuous sine wave signal results, when viewed in the frequency domain, in frequency components spaced at regular intervals. By appropriate selection of the square wave and sine wave frequencies, the modulation components resulting from combination of the square wave and sine wave signals are spaced between the components resulting from application of the square wave alone. Using a comb filter with appropriate pitch, the modulation signal components can be separated from the remainder of the signal spectrum and the power of the modulation signal components can provide an indicia of the active element non-linearity. A test capacitor can be added to each active element that can transfer the output signal to a currently unused electrode, thereby increasing the signal to noise ratio for the modulation signal components. In addition, the presence of the test capacitors permit the testing procedure to be performed prior to assembly of the display panels, thereby permitting the possibility of repair.

Figure 4:
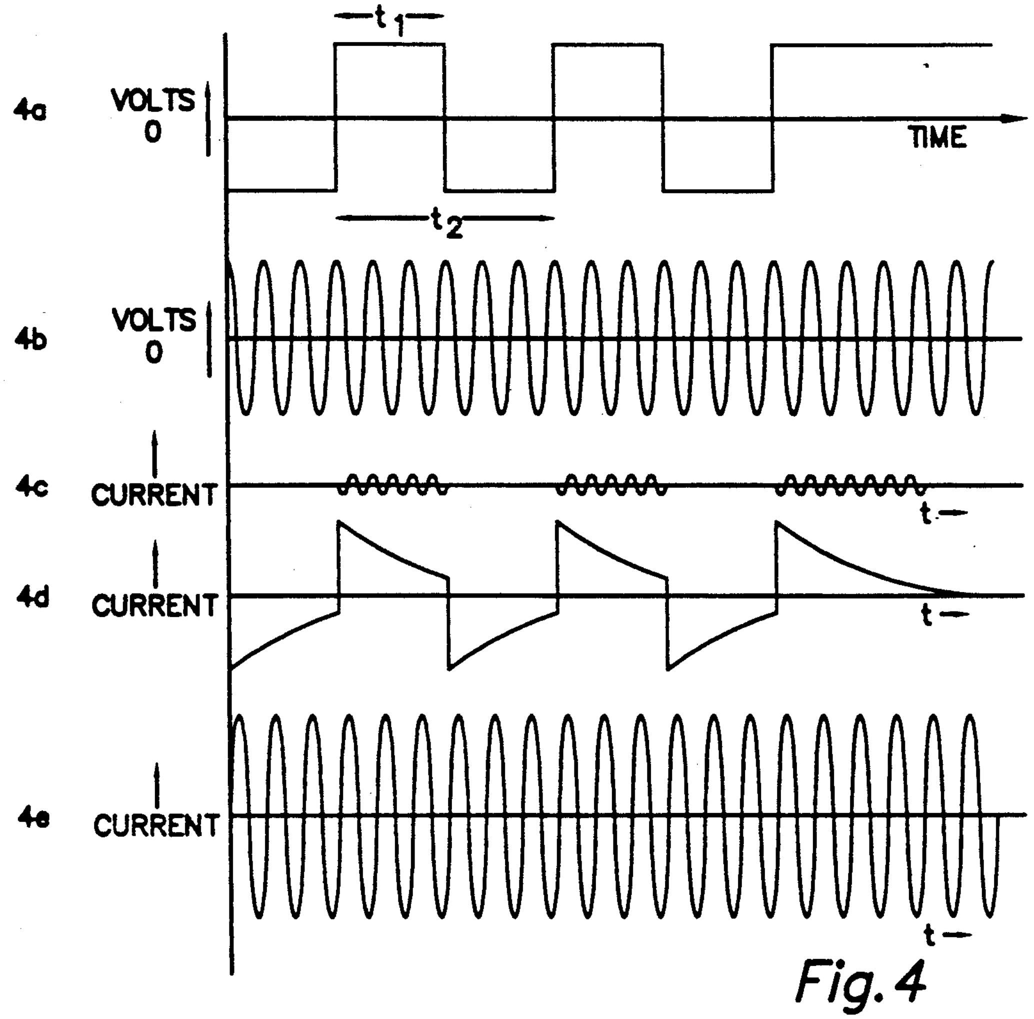
FIGS. 4*a*–4*c* illustrate the signals applied to the matrix display and the resulting signals in selected portions of the display in the time domain.

Referring to FIG. 3 and FIG. 4, the square wave signal applied to the row electrode 11 having an ON state for $t_1$ and having a periodicity of $t_2$ can be described by the equation:

$$f(t)=K_1 * II(t/t_1)**III(t/t_2) \quad (1)$$

where $K_1$ has a constant value, $$II(t/t_1) = 1 \text{ when } -t_1/2 < t < -t_1/2, \text{ and}$$
$$= 0 \text{ when } t_1/2 < t < -t_1/2, \text{ and}$$

$III(t/t_2)$ is a Dirac Comb function with a periodicity of $t_2$ seconds, the symbol * designating a multiplication operation and the symbol  designating a convolution operation. The current flowing from the row electrode 11 to the common electrode 10** through the parasitic capacitance $C_{SRBP}$ is given by the equation:

$$I(t)=f(t)*(jsC_{RBP}). \quad (2)$$

The spectrum of the current can be determined by the Fourier transform of the I(t) or $$I(s)=K* Sinc(t_1*s)*III(t_2*s) \quad (3)$$

where $K=[K*(j2\pi sC_{RBP})]$ and $III(tz*s)$ is a Dirac Comb function with a periodicity of $1/t_2$ Hz. From equation (3), the resulting power spectrum is concentrated with periodicity that is a function of (and therefore selectable by) the periodicity $1/t_2$ of the square wave signal in the time domain. The amplitude of each of the spectral components is a function of the ON state duration $t_1$ of the square wave signal in the time domain. Therefore, when an appropriate square wave signal is selected to activate the row electrode, the spectra of the TFT output modulation products can be interleaved between the spectral components existing in the common electrode connection whether the pixel of the display matrix is functional or not. A filter can be used to separate and sum these modulation products and then detect their amplitude.

When a sinusoidal function is applied to the column electrode, then the result is $$f(t)=\cos(Sot)*\{II(t/t_1)**III(t/t_2)\} \quad (4)$$

The Fourier transform of this function is;

$$F(s)=\{\tfrac{1}{2}\delta(s-s_0+\tfrac{1}{2}\delta(s+s_0))\}**t_1*sinc(t_1*s)*t_2*III(t_2*s) \quad (5)$$

Spectral profiles resulting from this equation are illustrated in FIG. 5 and FIG. 6, FIG. 5 representing the circumstance where the modulation products are superimposed.

When the square wave excitation frequency is not strictly periodic but exist only a finite period of time, the result in the time domain can be written:

$$f(t)=\{II(t/t_1)**III(t/t_2)\}*II(t/t_3)*\cos(Sot) \quad (6)$$

The term $II(t/t_3)$ causes a truncation of the periodic function at $t=\pm t_3/2$. The Fourier transform of equation 5 is given by:

$$F(s)=\{t_1*sinc(t_1*s)*t_2*III(t_2*s0\}**t_3*sinc(t_3*s)**\{\delta(s-s_0)+\delta(s+s_0)\} \quad (7)$$

The sine wave signal will typically have a much higher frequency and contributions from the finite duration of this signal can be ignored. The general effect of the finite duration of the square wave signal is a broadening of the row electrode excitation spectrum and the modulation spectrum. This broadening of the spectral components adversely affects the ability to separate these components, i.e., decreases the signal to noise ratio in attempting to detect only the modulation spectral components.

Other factors that impact the ability to detect the spectral components of the modulation products include the noise and the non-linearity of the transconductance amplifier driving the comb filter (covered for example by dynamic range limitations). The active element associated with the pixel can also provide non-linearity (during its ON time) in the system. The non-linearity provides intermodulation products that result in spectral component broadening with a decrease in the detectability of the modulation components.

The voltage levels at the output of the transconductance amplifier associated with the pixel active element can be so small that the resulting effect on the optical transmission through the liquid crystal pixel are not observable. The test of the pixel can therefore be conducted during normal display operation of the liquid crystal display.

In the liquid crystal displays, the capacitance associated with each pixel display element is small while the resistance of the ON state of the (field effect transistor) active element is large. (It is less in the ON state than the OFF state by approximately 5 orders of magnitude, but in the ON state it still exhibits high impedance.) Therefore, relatively small currents flow in the common electrode as a result of the activation of the active element (TFT). Of course, the common electrode current will increase as the number of simultaneously addressed active elements increases. A corresponding increase in the signal to noise ratio will result. An increase in the signal to noise ratio will result if a test capacitor is coupled between the driven terminal of the pixel display electrode and the row electrode associated with a row of thin film transistors adjacent to the row of thin film transistors currently being addressed, i.e., as shown in FIGS. 8 and 9. The test capacitor, with the plates positioned relatively close together, can provide lower impedance path for the TFT output signal and process that signal with less effect from other signals present in the common electrode.

Figure 11:
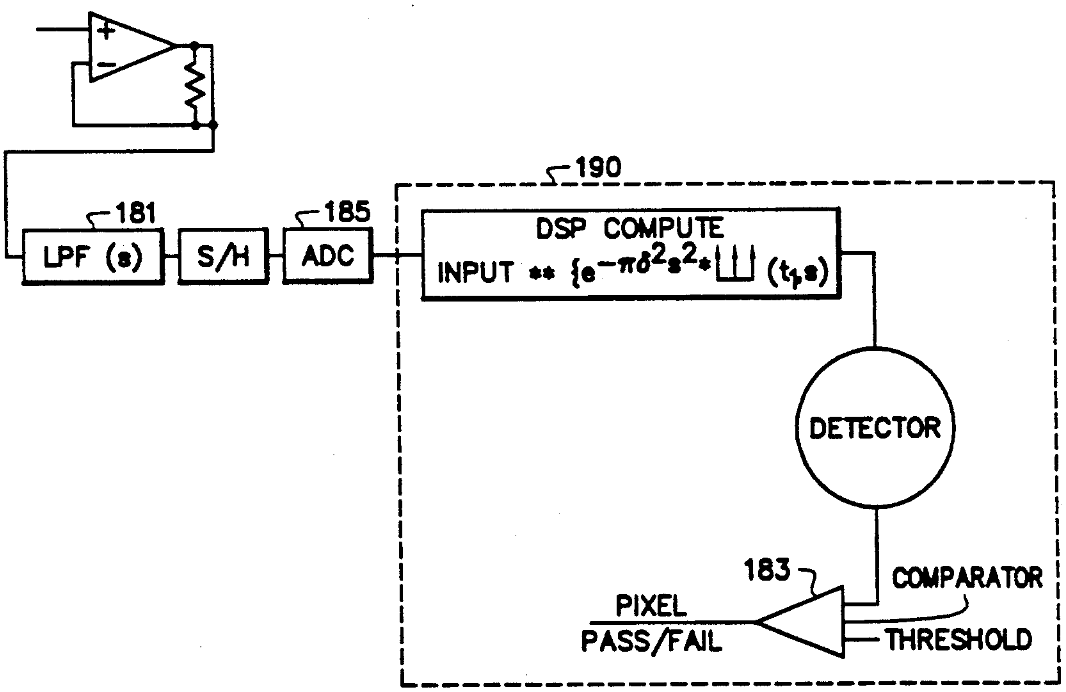
FIG. 11 illustrates the partition of the functions for testing each pixel of the display panel.

The comb filter can be implemented using electronic components or the function can be accomplished using digital signal processing techniques (as illustrated in FIG. 11). The desired response of a comb filter can be given by the equation:

$$F(s)=g(s)^{*}LPF(s)^{*}\{e^{-\pi^{*}\sigma^{2}S^{2}}{}^{**}III(t1\uparrow\uparrow\uparrow(t_1\cdot s))\} \quad (8)$$

where

F(s) is the signal input to the detector, g(s) is the spectrum of the signal output from the transconductance amplifier, LPF(s) is the band limiting and notch filter (at the column drive frequency)

$$e^{-\pi^{*}\sigma^{2}S^{2}}$$

is the frequency response of one of the combs of the comb filter, $\sigma$ being selected to control the width of the spectral components of the filter (Gaussian is used here as a simple example and is not optimal), and III($t_1$*s) is the replicating function which constructs the comb, $t_1$ being selected to position the combs of the comb filter in coincidence with the modulation components.

The transform of equation 8 into the time domain given by:

$$f(t)=f_z(t)^{**}\{e^{-\pi.\sigma^{2}t.t^{2}}\}^{*}(1/t_1)^{*}III(t/t_2)$$

where:

$f_z(t)$=g(t)**LPF(t), $f_z(t)$ being the signal containing the modulation products for which filtering is desired.

This invention has been described herein in considerable detail in order to comply with the Patent Statutes and to provide those skilled in the art with the information needed to apply the novel principles and to construct and use such specialized components as are required. However, it is understood that the invention can carry out on specifically different equipment and devices, and that various modifications, both by equipment details and operating procedures, can be accomplished without departing from the scope of the invention itself.

What is claimed is:

1. A method of testing a condition of an active element pixel wherein the active element pixel has a column drive electrode, a row drive electrode, and a common electrode, and wherein the method of testing the condition of an active element pixel comprises the steps of:

a. driving the column drive electrode with a first periodic signal having a first frequency spectrum with first frequency components;

b. driving the row drive electrode with a second periodic signal having a second frequency spectrum with second frequency components wherein the combination of the first periodic signal and second periodic signal causes a third periodic signal in the common electrode wherein the third periodic signal has a modulated frequency spectrum with modulated frequency components and wherein the second frequency spectrum is selected to provide the modulated frequency spectrum with modulated frequency components positioned between the second frequency components;

c. filtering the first frequency spectrum from the modulated frequency spectrum to provide a filtered signal with a filtered signal magnitude; and d. relating the filtered signal magnitude to the condition of the active element pixel.

2. The method of claim 1 wherein the first periodic signal comprises a square wave.

3. The method of claim 1 wherein the second periodic signal comprises a sine wave.

4. The method of claim 1 wherein a comb filter filters the first frequency spectrum from the modulated frequency spectrum.

5. The method of claim 1 wherein the modulated frequency spectrum is digitized to provide a digital modulated frequency spectrum which is processed by a micro-processor based comb filter to provide the filtered signal.

6. The method of claim 1 wherein the modulated frequency spectrum is digitized to provide a digital modulated frequency spectrum wherein the digital modulated frequency spectrum is processed by a digital signal processor based comb filter to provide the filtered signal.

7. The testing method of claim 1 wherein the active element pixel comprises:

a. a liquid crystal pixel having a fourth electrode and fifth electrode wherein the fifth electrode is connected to the common electrode; and b. a thin film field effect transistor having a gate terminal, a source terminal and a drain terminal wherein the drain terminal is connected to the fourth electrode and wherein the first periodic signal is applied to the gate terminal and wherein the second periodic signal is applied to the source terminal of the thin film transistor.

8. A method of testing a condition of a plurality of active element pixels wherein each active element pixel has a column drive electrode, a row drive electrode, and a common electrode, and wherein the method of testing the condition of a plurality of active element pixels comprises the steps of:

a. driving each column drive electrode in turn with a first periodic signal having a first frequency spectrum with first frequency components;

b. driving each row drive electrode in turn with a second periodic signal having a second frequency with second frequency components wherein the combination of the first periodic signal and second periodic signal causes a third periodic signal in the common electrode wherein the third periodic signal has a modulated frequency spectrum with modulated frequency components and wherein the second frequency spectrum is selected to provide the modulated frequency spectrum with modulated frequency components positioned between the second frequency components;

c. filtering in turn the first frequency spectrum from the modulated frequency spectrum to provide a filtered signal with a filtered signal magnitude;

d. detecting in turn which of the plurality of active element pixels was tested; and e. relating in turn the filtered signal magnitude to the condition of the active element pixel detected.

9. The method of claim 8 wherein the first periodic signal is a square wave.

10. The method of claim 9 wherein the second periodic signal is a sine wave.

11. The method of claim 10 wherein a comb filter filters the first frequency spectrum from the modulated frequency spectrum.

12. The method of claim 8 wherein the modulated frequency spectrum is digitized to provide a digital modulated frequency spectrum which is processed by a micro-processor based comb filter to provide the filtered signal.

13. The method of claim 8 wherein the modulated frequency spectrum is digitized to provide a digital modulated frequency spectrum wherein the digital modulated frequency spectrum is processed by a digital signal processor based comb filter to provide the filtered signal.

14. An apparatus for testing a condition of an active element pixel wherein the active element pixel has a column drive electrode, a row drive electrode, and a common electrode, and wherein the apparatus for testing the condition of an active element pixel comprises:

a. means for driving the column drive electrode with a first periodic signal having a first frequency spectrum with first frequency components;

b. means for driving the row drive electrode with a second periodic signal having a second frequency with second frequency components wherein the combination of the first periodic signal and second periodic signal causes a third periodic signal in the common electrode wherein the third periodic signal has a modulated frequency spectrum with modulated frequency components and wherein the second frequency spectrum is selected to provide the modulated frequency spectrum with modulated frequency components positioned between the second frequency components;

c. means for filtering the first frequency spectrum from the modulated frequency spectrum to provide a filtered signal with a filtered signal magnitude; and d. means for relating the filtered signal magnitude to the condition of the active element pixel.

15. The apparatus of claim 14 wherein the first periodic signal comprises a square wave.

16. The apparatus of claim 14 wherein the second periodic signal comprises a sine wave.

17. The apparatus of claim 14 wherein a comb filter filters the first frequency spectrum from the modulated frequency spectrum.

18. The apparatus of claim 14 wherein the modulated frequency spectrum is digitized to provide a digital modulated frequency spectrum which is processed by a micro-processor based comb filter to provide the filtered signal.

19. The apparatus of claim 14 wherein the modulated frequency spectrum is digitized to provide a digital modulated frequency spectrum wherein the digital modulated frequency spectrum is processed by a digital signal processor based comb filter to provide the filtered signal.

20. An apparatus for testing a condition of a plurality of active element pixels wherein each active element pixel has a column drive electrode, a row drive electrode, and a common electrode, and wherein the apparatus for testing the condition of a plurality of active element pixels comprises:

a. means for driving each column drive electrode in turn with a first periodic signal having a first frequency spectrum with first frequency components;

b. means for driving each row drive electrode in turn with a second periodic signal having a second frequency with second frequency components wherein the combination of the first periodic signal and second periodic signal causes a third periodic signal in the common electrode wherein the third periodic signal has a modulated frequency spectrum with modulated frequency components and wherein the second frequency spectrum is selected to provide the modulated frequency spectrum with modulated frequency components positioned between the second frequency components;

c. means for filtering in turn the first frequency spectrum from the modulated frequency spectrum to provide a filtered signal with a filtered signal magnitude;

d. means for detecting which of the plurality of active element pixels was tested; and e. means for relating the filtered signal magnitude to the condition of the active element pixel detected.

21. The apparatus of claim 20 wherein the first periodic signal comprises a square wave.

22. The apparatus of claim 20 wherein the second periodic signal comprises a sine wave.

23. The apparatus of claim 20 wherein a comb filter filters the first frequency spectrum from the modulated frequency spectrum.

24. The apparatus of claim 20 wherein the modulated frequency spectrum is digitized to provide a digital modulated frequency spectrum which is processed by a micro-processor based comb filter to provide the filtered signal.

25. The apparatus of claim 20 wherein the modulated frequency spectrum is digitized to provide a digital modulated frequency spectrum wherein the digital modulated frequency spectrum is processed by a digital signal processor based comb filter to provide the filtered signal.

26. An apparatus for testing a condition of a plurality of active element pixels arranged in rows and columns wherein each active element pixel has a column drive electrode, a row drive electrode, and a common electrode, wherein all column drive electrodes in any particular column are connected to a plurality of column buses, wherein all row drive electrodes in any particular row are connected to a plurality of row buses, wherein all common electrodes in any particular row are connected to a plurality of common buses, and wherein the apparatus for testing the condition of a plurality of active element pixels comprises:

a. means for driving each column bus in turn with a first periodic signal having a first frequency spectrum with first frequency components;

b. means for driving every other row bus with a second periodic signal having a second frequency with second frequency components wherein the combination of the first periodic signal and second periodic signal causes a third periodic signal in the common electrode wherein the third periodic signal has a modulated frequency spectrum with modulated frequency components and wherein the second frequency spectrum is selected to provide the modulated frequency spectrum with modulated frequency components positioned between the second frequency components;

c. a plurality of means for switching between every other common bus in response to a switching signal coordinated with the means for driving every other row bus having a switched common bus output signal;

d. a plurality of means for filtering the first frequency spectrum from the modulated frequency spectrum to provide a filtered signal with a filtered signal magnitude wherein each means for filtering is connected to the switched common bus output signal;

e. a plurality of means for detecting which of the plurality of active element pixels was tested wherein each means for detecting is connected to the means for filtering; and f. means for relating the filtered signal magnitude to the condition of the active element pixel detected.

27. The apparatus of claim 26 wherein the first periodic signal comprises a square wave.

28. The apparatus of claim 26 wherein the second periodic signal comprises a sine wave.

29. The apparatus of claim 26 wherein a comb filter filters the first frequency spectrum from the modulated frequency spectrum.

30. The apparatus of claim 26 wherein the modulated frequency spectrum is digitized to provide a digital modulated frequency spectrum which is processed by a micro-processor based comb filter to provide the filtered signal.

31. The apparatus of claim 26 wherein the modulated frequency spectrum is digitized to provide a digital modulated frequency spectrum wherein the digital modulated frequency spectrum is processed by a digital signal processor based comb filter to provide the filtered signal.

32. The testing apparatus of claim 26 wherein each active element pixel comprises:

a. a liquid crystal pixel having a fourth electrode and fifth electrode wherein the fifth electrode is connected to the common electrode; and b. a thin film field effect transistor having a gate terminal, a source terminal and a drain terminal wherein the drain terminal is connected to the fourth electrode and wherein the first periodic signal is applied to the gate terminal and wherein the second period signal is applied to the source terminal of the thin film transistor.

* * * * *